United States Patent
Menceloglu et al.

(10) Patent No.: US 9,850,572 B2
(45) Date of Patent: Dec. 26, 2017

(54) METHOD FOR PRODUCTION OF THREE-DIMENSIONAL CLOSED GRAPHENE-BASED NANO-/MICROSTRUCTURES

(71) Applicant: SABANCI ÜNIVERSITESI, Tuzla, Istanbul (TR)

(72) Inventors: Yusuf Ziya Menceloglu, Istanbul (TR); Burcu Saner Okan, Istanbul (TR); Mehmet Yildiz, Istanbul (TR)

(73) Assignee: SABANCI ÜNIVERSITESI, Tuzla, Istanbul (TR)

( * ) Notice: Subject to any disclaimer, the term of this patent is extended or adjusted under 35 U.S.C. 154(b) by 156 days.

(21) Appl. No.: 14/887,386

(22) Filed: Oct. 20, 2015

(65) Prior Publication Data

US 2016/0108517 A1    Apr. 21, 2016

(30) Foreign Application Priority Data

Oct. 20, 2014    (EP) .................................... 14189504

(51) Int. Cl.
| | | |
|---|---|---|
| *B01J 13/14* | (2006.01) | |
| *C01B 31/04* | (2006.01) | |
| *C23C 16/30* | (2006.01) | |
| *C23C 16/44* | (2006.01) | |

(52) U.S. Cl.
CPC ............... *C23C 16/30* (2013.01); *B01J 13/14* (2013.01); *C23C 16/44* (2013.01)

(58) Field of Classification Search
None
See application file for complete search history.

(56) References Cited

U.S. PATENT DOCUMENTS

| | | | | |
|---|---|---|---|---|
| 4,793,980 A | * | 12/1988 | Torobin | B01J 13/04 208/112 |
| 4,867,931 A | * | 9/1989 | Cochran, Jr. | B01J 13/04 264/12 |
| 5,212,143 A | * | 5/1993 | Torobin | B01J 13/04 264/129 |
| 8,663,511 B2 | * | 3/2014 | Kim | A61K 35/39 264/4 |
| 9,331,283 B2 | * | 5/2016 | Lim | H01L 51/0038 |

(Continued)

*Primary Examiner* — Mary Lynn F Theisen
(74) *Attorney, Agent, or Firm* — Epstein Drangel LLP; Robert L. Epstein

(57) ABSTRACT

The present invention proposes a production method for obtainment of three-dimensional closed graphene-based nano-/microstructures (10) using a coaxial multilayer core-shell production process (1000) comprising a coaxial flow system (100) having a first flow path (101) and a first fluid exit (1011) at an end of said first flow path; and a second flow path (102) circumferentially surrounding said first flow path (101), said second flow path having a second fluid exit (1021); wherein a first fluid (1) flows through the first flow path and exits through the first fluid exit (1011); and a second fluid (2) which is immiscible with the first fluid (1) under the conditions where said production method is conducted, flows through the second flow path (102) and exits through the second fluid exit (1021) such that the second fluid (2) circumferentially covers the first fluid (1) upon leaving the coaxial flow system (100); said second fluid (2) comprises a graphene-based material, a polymeric material and solvent.

7 Claims, 1 Drawing Sheet

(56) References Cited

U.S. PATENT DOCUMENTS

| | | | |
|---|---|---|---|
| 2008/0135245 A1* | 6/2008 | Smith | C04B 35/04 |
| | | | 166/280.2 |
| 2012/0171492 A1* | 7/2012 | Muehlbach | A61K 8/11 |
| | | | 428/402.2 |
| 2015/0118491 A1* | 4/2015 | Wu | C01B 31/0446 |
| | | | 428/401 |

* cited by examiner

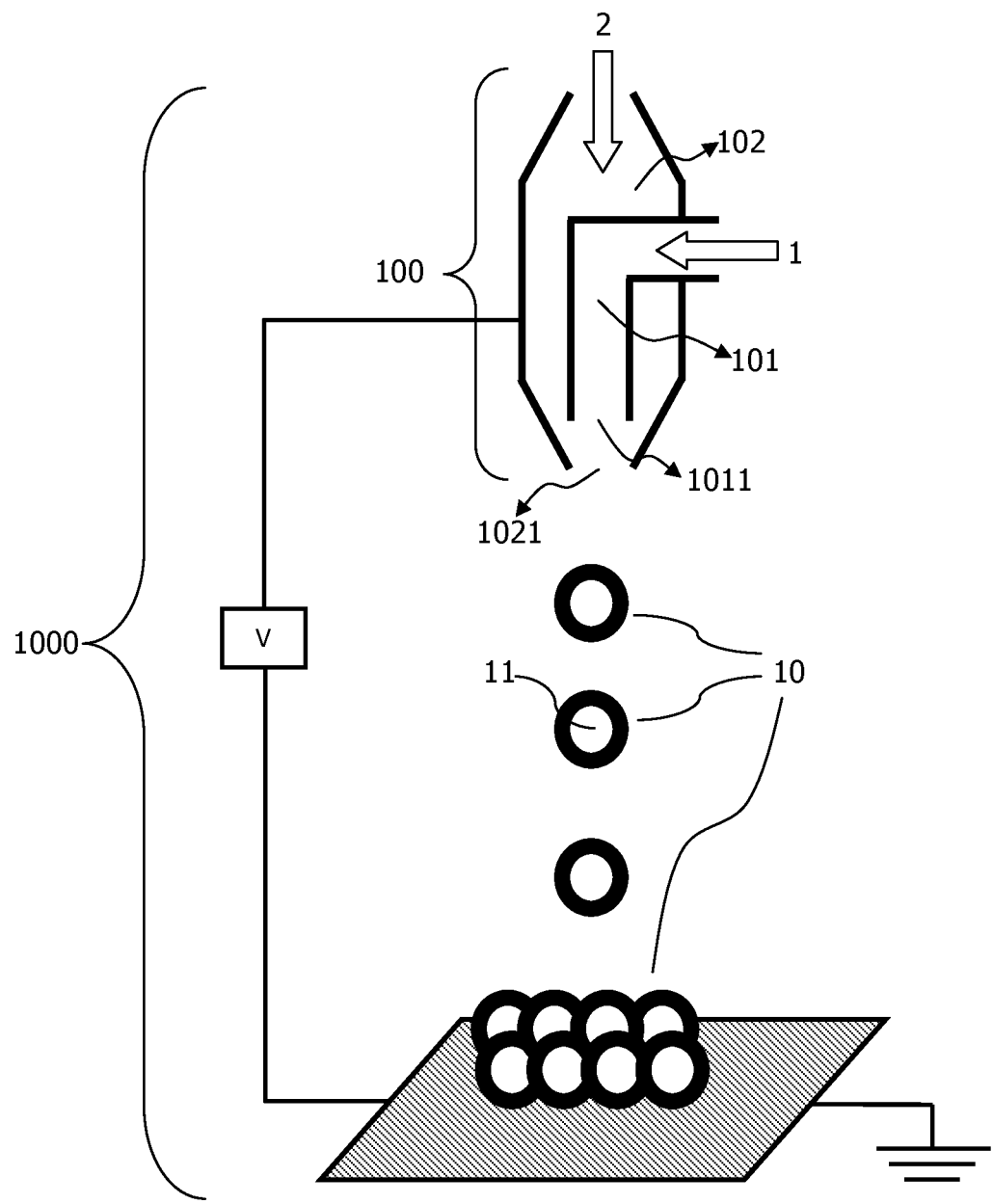

METHOD FOR PRODUCTION OF THREE-DIMENSIONAL CLOSED GRAPHENE-BASED NANO-/MICROSTRUCTURES

TECHNICAL FIELD OF THE INVENTION

The present invention relates to a production method for three-dimensional closed graphene-based nano-/microstructures using a coaxial multilayer core-shell production process.

BACKGROUND OF THE INVENTION

Graphene has attracted great interest due to its unique electronic, thermal and mechanical properties, resulting from its two-dimensional (2D) structure, and to its potential applications like microchips, chemical sensing instruments, biosensors, energy storage devices and other technologies. With appropriate surface treatments, single graphene sheets can be separated from the graphite material and the layer-to-layer distance can be extended (DOI: 10.1021/cm0630800, DOI: 10.1016/j.fuel.2010.03.036). Graphene nanosheets can act as effective conductive fillers in polymer matrices due to the high aspect ratio, excellent electrical conductivity and cost efficiency.

One of the applicable methods is graphite oxidation in order to reduce the strong bonding between sheets in graphite and receive monolayer graphene sheet. The structure of graphite oxide (GO) resembles graphite but only difference is that the $sp^3$ hybridization in carbon atoms and thus the individual layers are considerably bent (DOI: 10.1007/BF00943889). A very important property of graphene is its stability at ambient conditions: it can exist by being rippled rather than completely flat in a free-standing state (DOI: 10.1016/S1369-7021(06)71788-6). Therefore, electrical conductivity and surface area of graphene sheets tend to decrease due to said dimensional change of the structure.

2D graphene nanosheets have several drawbacks, especially when they are employed in bulk systems: the graphene sheets agglomerate in several polymeric matrices and solutions; the surface area and electrical conductivity of the graphene sheets decrease; graphene layers restack after reduction process; and it is difficult to process multi-layer graphene.

Available techniques in the art for synthesis of solid, core-shell type or hollow closed 3D spherical carbon bodies are as follows: arc discharge, laser ablasion and plasma techniques, shock compression techniques, chemical vapor deposition, autoclave process, microemulsion polymerization, and catalytic carbonization. In a study, hollow graphene oxide spheres were fabricated from graphene oxide nanosheets utilizing a water-in-oil emulsion technique without surfactant (DOI: 10.1039/B927302F). Cao et al. (DOI: 10.1016/j.carbon.2012.12.075) synthesized hollow graphene spheres at 160° C. for 10 h in an autoclave by hydrothermal process. In addition, template assisted chemical vapor deposition technique is used for the production of 3-dimensional graphene networks by changing the gas flow ratio and growth time. In this technique, nickel foam is used as a template and carbon source is provided at about 950° C. under Argon and $H_2$ atmosphere and then the interconnected 3-D graphene sheets are obtained (U.S. 2012/0128573 A1, DOI: 10.1039/C1JM13418C, DOI: 10.1016/j.apsusc.2014.05.171, DOI: 10.1016/j.matlet.2014.02.077). In another study, mesoporous graphene nanoballs are synthesized by using functionalized polystyrene balls deposited catalyst under high temperature and a hydrogen gas environment during chemical vapor deposition process (DOI: 10.1021/nn401850z). Moreover, graphene hollow balls are prepared by covering polystyrene balls with graphene oxide sheets and then calcination at 420° C. for 2 h (DOI: 10.1039/C3TA12789C).

Instead of polymeric spheres, $SiO_2$, organic oxide, is used as a template for the production of graphene hollow spheres and oxides are removed by hydrofluoric acid treatment (DOI: 10.1039/C3NR03794K). In the literature, there are also some techniques such as soft templating (colloidal template) (PMID: 10747405), hard templating (silicon template) (DOI: 10.1021/cm052219o), solvothermal technique (DOI: 10.1016/j.ssc.2004.07.004), sol pyrolysis (DOI: 10.1002/adma.200305697) and microemulsion polymerization (DOI: 10.1039/B316881F) for the production of hollow carbon spheres.

However, the main problem of graphene sheets in various shapes is the agglomeration of the sheets in polymeric matrices and solutions, which leads to a decrease in electrical conductivity and surface area of graphene sheets and affects negatively the utilization of graphene in several technological fields such as electrodes for fuel cells, supercapacitors and Li-ion batteries, catalyst supports and nanocomposite production. There are some drawbacks of available techniques for the production of 3-dimensional graphene and graphene based three dimensional bodies (e.g. in form of a sphere) which are high cost and uncontrolled size and fails in shape. A further problem is; that it is not possible to produce orderly aligned and repeating graphene spheres by applying available techniques and the production capacity is also limited.

In conventional processes, size of spheres directly depends on the template and deformation of spheres and hollowness is observed because of in-situ process.

Another problem is the stacking of graphene layers after a reduction process and an electrospinning process increases the distance between graphene layers and prevents restacking of graphene layers under electrical field. Upon an oxidation process, the change of stacking order between graphene layers and the random destruction of graphitic structure causes disorder in percent crystallinity; and it further causes decrease in surface area, electrical conductivity and mechanical properties.

Because of the characteristics of the above mentioned previous techniques, the graphene spheres obtained therewith are produced only in low amounts with high costs, since said techniques employ template-based multi-step procedures.

OBJECTS OF THE INVENTION

Primary object of the present invention is to overcome the abovementioned shortcomings of the prior art.

Another object of the present invention is to provide repeatable and reproducible obtainment of three-dimensional closed graphene-based nano-/microstructures with controllable size and shape.

Yet another object of the present invention is to provide a simple method for production of three-dimensional closed graphene-based nano-/microstructures without capacity restriction and low cost.

Another object of the present invention is to enable the obtainment three-dimensional closed graphene-based nano-/microstructures having optimal electrical conductivity and surface area per employed graphene weight.

Further an object of the present invention is to enable alignment of graphene sheets in matrix and prevent restacking and agglomeration of graphene layers under electrical field.

SUMMARY OF THE INVENTION

The present invention proposes a production method for obtainment of three-dimensional closed graphene-based nano-/microstructures using a coaxial multilayer core-shell production process comprising a coaxial flow system having a first flow path and a first fluid exit at an end of said first flow path; and a second flow path circumferentially surrounding said first flow path, said second flow path having a second fluid exit; wherein a first fluid flows through the first flow path and exits through the first fluid exit; and a second fluid which is immiscible with the first fluid under the conditions where said production method is conducted, flows through the second flow path and exits through the second fluid exit such that the second fluid circumferentially covers the first fluid upon leaving the coaxial flow system; said second fluid comprises a graphene-based material, a polymeric material and solvent.

BRIEF DESCRIPTION OF THE FIGURE

The FIGURE, whose brief explanation is herewith provided, is solely intended for providing a better understanding of the present invention and is as such not intended to define the scope of protection or the context in which said scope is to be interpreted in the absence of the description.

FIG. 1 is schematic view of a coaxial flow system for application of the method according to the present invention by melt/solution core-shell spinning and spraying techniques.

DETAILED DESCRIPTION OF THE INVENTION

Referring now the FIGURE outlined before, the present invention proposes a production method obtainment of three-dimensional closed graphene-based nano-/microstructures (10) using a coaxial multilayer core-shell production process (1000) comprising a coaxial flow system (100) having a first flow path (101) and a first fluid exit (1011) at an end of said first flow path; and a second flow path (102) circumferentially surrounding said first flow path (101), said second flow path having a second fluid exit (1021), wherein
 a first fluid (1) flows through the first flow path and exits through the first fluid exit (1011);
 a second fluid (2) which is immiscible with the first fluid (1) under the conditions where said production method is conducted, flows through the second flow path (102) and exits through the second fluid exit (1021) such that the second fluid (2) circumferentially covers the first fluid (1) upon leaving the coaxial flow system (100); said second fluid (2) comprises a graphene-based material, a polymeric material and solvent; and
 said graphene-based material is selected from the list consisting of graphene oxide, microwave exfoliated graphite oxide, thermally exfoliated graphene oxide and functionalized graphene.

The polymeric material can be considered as one or more polymer (for playing a role as a carrier polymeric material for the graphene-based material) dissolved in a suitable solvent such that the second fluid shows suitable flow properties for electrospraying.

Said solvent(s) can be selected from the list consisting of organic solvents, and aqueous solutions and mixtures thereof for obtaining suitable physicochemical properties (e.g. polarity, surface tension, vapor pressure, etc.) such that said graphene-based material and polymeric material in the second fluid can be carried along the second follow path (102), and such that said second fluid (2) coats the first fluid (1) upon exiting the coaxial flow system (100) without mixing with said first fluid (1).

Preferably, the polymeric material in the second fluid comprises one or more substance selected from the list consisting of polyacrylonitrile, polyglycidyl methacrylate, polystyrene, polymethyl methacrylate, polyacrylamide, polyacrylamide, polyacrylic acid, conductive polymers, copolymers and biopolymers thereof. In case where the polymeric material in the second fluid is electrically conductive, in use, graphene nanosheets serve as electron acceptors and conductive polymers such as polyaniline and polypyrrole serve as electron donors, thus in three-dimensional closed graphene-based nano-/microstructures (10) obtained with the method according to the present invention, the electrical conductivity of graphene-based material is combined with that of conductive polymers. Polyacrylonitrile and its copolymers have a high carbonization degree, thus they provide the formation of a carbon network after carbonization process. Thermoplastic polymers such as polystyrene and polymethyl methacrylate provide ease to formation of a spherical topology during electrospraying process.

In an alternative application of the method according to the present invention, the first fluid comprises one or more solvent which preferably further comprises inorganic nanoparticles preferably selected from a list consisting of titanium dioxide, silicon dioxide, and transition metal catalysts.

Said graphene-based material is preferably selected from the list consisting of graphene oxide, microwave exfoliated graphite oxide, thermally exfoliated graphene oxide and functionalized graphene. The hydrophilicity of graphene sheets in electrospun solutions is tailored by controlling the C/O ratio (i.e. the proportion of Carbon atoms to Oxygen atoms) on the surface of graphene. Graphene suspensions are prepared in organic solvents, alcohols, water and mixtures thereof.

The method according to the present invention enables the obtainment of three-dimensional closed graphene-based nano-/microstructures (10) having a coating layer comprising graphene sheets (i.e. graphene-based material) covering a core (11) with different physicochemical properties than those of said coating layer. Thus, the alignment of graphene sheets in matrix and prevent restacking and agglomeration of graphene layers under electrical field is enabled.

According to one aspect of the present invention, the core is a volume with tailored hollowness, including a gas (e.g. air); thus, e.g. hollow graphene spheres can be obtained which bring advantages in several fields such as catalyst support, drug-delivery, and electrode materials for energy storage devices and as a substrate for developing core/shell structure composites. To this end, in an aspect according to the present invention, the state of the first fluid is gas. Preferably, said gas is selected from the list consisting of air, nitrogen, hydrogen, and noble gases. Said gas can either be pressurized (up to 2 atm) or in ambient pressure (i.e. 1 atm).

According to another aspect of the present invention, said structures comprise further material (e.g. polymers) in their cores (11) customized in accordance with the necessities of an area of utilization of said nano/microstructures. To this end, in another embodiment according to the present invention, the state of the first fluid is liquid.

Three-dimensional closed graphene-based nano-/microstructures which are hollow can also be obtained by the removal of core material by thermal treatment. To this end, preferably, the first fluid is a mixture comprising a substance removable by thermal treatment, and the method according to the present invention further comprises a subsequent step of evacuation of the core by thermal treatment of the three-dimensional closed graphene-based nano-/microstructures (10). Said thermal treatment is for removal of substance(s) in the cores (11) at high temperature, by maintaining the integrity of the coating layer. Said thermal treatment may include calcination, or heating of the graphene-based nano-microstructures (10) under an inert atmosphere or under air.

The substance removable by thermal treatment can be a removable polymeric material, which is preferably selected from the list consisting of soluble thermoplastic homopolymers and, soluble thermoplastic copolymers, and mixtures thereof. Preferably, said removable polymeric material is one or more substance selected from the list consisting of polystyrene, polymethyl methacrylate, copolymers thereof, polyacrylonitrile, and copolymers of polyacrylonitrile. The terms 'soluble thermoplastic homopolymer' and 'soluble thermoplastic copolymer' refer to thermoplastic homopolymers and copolymers soluble in suitable solvents for the obtainment of a first fluid having suitable flow properties for electrospraying. Person skilled in the art can accordingly decide for suitable solvents for solving such thermoplastic homopolymers and copolymers.

In a preferred aspect according to the present invention, metal catalysts which are important for fuel cells and batteries can be deposited on surfaces of coating layer by employing said catalysts in the second fluid.

By introducing further flow path(s) and respective annular fluid exit(s) for further fluid(s), number and behavior of layers covering the core can be tailored. To this end, according to another embodiment of the present invention, said coaxial flow system comprises at least one further flow path and respective annular fluid exit(s) circumferentially surrounding at least the first fluid exit; and a respective further fluid phase immiscible with the fluid phases adjacent thereto, flows through each/said further fluid exit.

Preferably, said coaxial multilayer core-shell production process is melt spinning, solution electrospinning, printing or electrospraying. The three-dimensional closed graphene-based nano-/microstructures obtained with the method according to the present invention have a consistent order and repeatability.

In a laboratory-scale trial using the method according to the present invention, core-shell spheres containing graphene sheets are firstly synthesized using electrospraying process. Said exemplary lab-scale obtainment of three-dimensional closed graphene-based nano-/microstructures (10) according to the method of the present invention is described below in detail. By giving said example, it is solely intended for providing a better understanding of the present invention and is as such not intended to define the scope of protection or the context in which said scope is to be interpreted in the absence of the description:

EXAMPLE

In an exemplary laboratory-scale trial, thermally exfoliated graphene oxide with three different concentrations (0.025%, 0.05% and 0.1%) was dispersed in dimethyl formamide by probe sonication providing well-dispersed graphene suspensions for use as second fluid (2). Then, polystyrene was added to obtain polymer mixtures and then stirred at room temperature for 1 day. Polymer mixtures of 20% (w/w) polystyrene concentration were used to produce hollow spheres which are the desired three-dimensional closed graphene-based nano-/microstructures (10). Instead of polystyrene, polymethyl methacrylate and poly(styrene-co-methylmethacrylate) (w:w=1:1) were also successfully used to prepare graphene-based mixtures for use as the second fluid (2). Atmospheric air ($P \approx 1$ atm) was used as the first fluid during electrospinning. A suitable voltage value for obtainment of graphene-based nano-/microstructures starting from above mentioned mixture having 0.05% graphene (w/w percentage of graphene-based material in total weight of the solvent in the second fluid) was 16 kV; and the distance between collector and syringe (which comprises the first and second fluid outlets (1011, 1021)) was adjusted to 8 cm. The droplet on the tip of syringe nozzle (which comprises second fluid outlet (1012)) was controlled by adjusting system parameters (e.g. voltage, distance between collector and syringe, flow rate and pressure of the second fluid) to balance the surface tension of the second fluid, and to balance the electrical force. Hence, 2-dimensional graphene sheets were converted into 3-dimensional closed hollow structures, by embedding said graphene sheets inside the coating layer of said structures (hollow spheres).

Upon electrospraying, graphene-based material in form of sheets are coated by polymeric layers and thus graphene sheets are preserved in layered, closed 3D nano-/microstructures.

Meanwhile, the surface tension of the second fluid results in partition of the first fluid into uniform spherical phases covered by the second fluid, thus three-dimensional closed graphene-based nano/microstructures (e.g. spheres coated with graphene-based coating layers) are obtained. The phenomenon explained in this paragraph is valid for any aspect according to the present invention.

In another aspect according to the present invention, the second fluid (2) further comprises one or more catalysts selected from the list consisting of transition metals, transition metal complexes and metal salts for providing catalytic activity to the three-dimensional closed graphene-based nano-/microstructures (10) in further uses thereof.

The obtainment of three-dimensional closed graphene-based nano/microstructures solves the problem of stacking of graphene layers, since the 2D (two-dimensional) structure of graphene is turned into 3D (three-dimensional) by core-shell production processes/techniques. The present invention further provides shape and size control of said three-dimensional closed graphene-based nano/microstructures. In electrode industry, the porosity in electrodes used in energy conversion and storage systems directly affects the capacitance properties. Using the products obtained by the method according to the present invention, the porosity of electrodes can be controlled with three-dimensional closed (e.g. ball-like) graphene-based multiphase nano/microstructures obtained by core-shell production techniques such as solution electrospraying. The method according to the present invention also provides that the obtained three-dimensional closed graphene-based nano-/microstructures to have optimal electrical conductivity and surface area per employed graphene weight; which is a quality in great demand in several technological fields such as electrodes for fuel cells, supercapacitors and Li-ion batteries, catalyst supports and nanocomposite production. The method according to the present invention also provides adjustable properties of the obtained nano-/microstructures, such as core diameter and coating layer thickness (or shell thickness) by adjusting system and process parameters and such as fluid flow rates, fluid viscosities, surface tensions and dielectric constants of fluids, fluid compositions and component concentrations, polymer molecular weights, solvent evaporation rates, process temperature, humidity, voltage, distance between collector and syringe, etc.

It is important to control the shape of graphene without stacking, in order to stabilize its characteristic properties. With this invention, mechanical properties, electrical properties and surface area of graphene sheets per graphene amount used, are preserved; and the dimensional change (i.e. from 2D to 3D) increases the mobility and diffusion through matrix (i.e. polymer matrix formed based on the second fluid) and prevents the agglomeration and restacking of graphene sheets. The remarkable physical, chemical and mechanical properties of graphene are mainly preserved in of three-dimensional graphene-based nano-/microstructures obtainable with the method according to the present invention, which opens up the extensive applications especially in energy storage devices.

Further, since the method according to the present invention is suitable for continuous production of three-dimensional closed graphene-based nano-/microstructures, it is a low cost method without capacity restriction.

Main potential uses of three-dimensional closed graphene-based nano-/microstructures as obtained using the method according to the present invention are: as an electrode material in long-lasting fuel cells and capacitors by providing porous surface and high surface area, as catalyst support in Li-ion batteries, as reinforcing agent in composite materials by providing large internal volume and increasing the storage capacity, encapsulation of active transition metals, and as a lubricating agent, drug delivery.

Thus the following objects are achieved by the present invention:

the abovementioned shortcomings of the prior art are overcome, repeatable and reproducible obtainment of three-dimensional closed graphene-based nano-/microstructures with controllable size and shape is provided, production of three-dimensional closed graphene-based nano-/microstructures without capacity restriction and low cost is provided, obtainment three-dimensional closed graphene-based nano-/microstructures having optimal electrical conductivity and surface area per employed graphene weight is enabled.

alignment of graphene sheets in matrix and prevent restacking and agglomeration of graphene layers under electrical field is enabled.

The invention claimed is:

1. A production method for obtainment of three-dimensional closed graphene-based nano-/microstructures using a coaxial multilayer core-shell production process comprising a coaxial flow system having a first flow path and a first fluid exit at an end of said first flow path; and a second flow path circumferentially surrounding said first flow path, said second flow path having a second fluid exit, wherein a first fluid flows through the first flow path and exits through the first fluid exit;

a second fluid which is immiscible with the first fluid under the conditions where said production method is conducted, flows through the second flow path and exits through the second fluid exit such that the second fluid circumferentially covers the first fluid upon leaving the coaxial flow system; said second fluid comprises a graphene-based material, a polymeric material and solvent; and said graphene-based material is one or more material selected from the list consisting of gruphene oxide, microwave exfoliated graphite oxide, thermally exfoliated graphene oxide, and funetionalized graphene;

further wherein the first fluid is a mixture comprising one or more substance selected from the list consisting of polystyrene, copolymers thereof, polyacrylonitrile, and polyacrylonitrile based functionalized copolymers; and the method further comprises a subsequent step of removal of said substance by thermal treatment of the three-dimensional closed graphene-based nano-/microstructures.

2. Method according to the claim 1, wherein said polymeric material comprises one of more substance selected from the list consisting of polyacrylonitrile, copolymers thereof, polymethyl methacrylate, methacrylate, polystyrene, polyaerylaimide, polyacrylic acid, copolymers of said polymers, conductive polymers, and, biopolymers thereof.

3. Method according to the claim 1, wherein the first fluid comprises one or more solvent which further comprises inorganic nanoparticles selected from a list consisting of titanium dioxide, silicon dioxide, and transition metal catalysts.

4. Method according to the claim 1, wherein said solvent is selected from the list consisting of organic solvents, aqueous solutions, and mixtures thereof.

5. Method according to claim 1, wherein the second fluid further comprises one or more catalyst selected from the list consisting of transition metals, transition metal complexes and metal salts for providing catalytic activity to the three-dimensional closed graphene-based nano-/microstructures in further uses thereof.

6. Method according to claim 1, wherein said coaxial multilayer core-shell production process is melt spinning, solution electrospinning, printing or electrospraying.

7. Method according to claim 1, wherein said coaxial flow system comprises at least one further flow path and respective fluid exit(s); and a respective further fluid phase immiscible with any fluid adjacent thereto flows through each/said further fluid exit such that the further fluid circumferentially surrounds the first fluid upon leaving said further flow path.

* * * * *